US008004855B2

(12) United States Patent
Salama et al.

(10) Patent No.: US 8,004,855 B2
(45) Date of Patent: Aug. 23, 2011

(54) RECONFIGURABLE DATA PROCESSING SYSTEM

(75) Inventors: Yassir Salama, Rome, NY (US); Assem Salama, Rome, NY (US); Dennis Fitzgerald, Rome, NY (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 1446 days.

(21) Appl. No.: 11/481,884

(22) Filed: Jul. 7, 2006

(65) Prior Publication Data
US 2008/0007928 A1   Jan. 10, 2008

(51) Int. Cl.
*H05K 1/11* (2006.01)
(52) U.S. Cl. .................. 361/784; 361/763; 361/764
(58) Field of Classification Search ............... 361/784; 365/185.28
See application file for complete search history.

(56) References Cited

U.S. PATENT DOCUMENTS

| | | | |
|---|---|---|---|
| 5,796,623 A | 8/1998 | Butts et al. | |
| 6,048,752 A * | 4/2000 | Linderman | 438/109 |
| 6,421,251 B1 | 7/2002 | Lin | |
| 6,469,404 B1 | 10/2002 | Pohjola | |
| 6,874,051 B2 * | 3/2005 | Gesch et al. | 710/300 |
| 2004/0066615 A1 * | 4/2004 | Pavesi et al. | 361/683 |
| 2004/0262777 A1 * | 12/2004 | Kim et al. | 257/778 |
| 2005/0073819 A1 * | 4/2005 | McCubbrey | 361/785 |

OTHER PUBLICATIONS

PCT International Search Report and Written Opinion in counterpart International Application No. PCT/US 07/72833 dated Nov. 26, 2008.

* cited by examiner

*Primary Examiner* — Kambiz Zand
*Assistant Examiner* — Abiy Getachew
(74) *Attorney, Agent, or Firm* — Edell, Shapiro & Finnan, LLC

(57) ABSTRACT

A reconfigurable processing system is provided that comprises a plurality of programmable processing modules arranged on a circuit board. Each of the programmable processing modules is capable of being populated by a programmable integrated circuit of a variety of processing capabilities. Conductive traces on the circuit board connect to the programmable processing modules and the conductive traces are arranged on the circuit board so as to accommodate use of the programmable integrated circuits of varying processing capabilities in the programmable processing modules without the need to alter conductive trace footprints on the circuit board for the programmable processing modules. At least one interface circuit arranged on the circuit board to interface signals to and from the circuit board.

24 Claims, 7 Drawing Sheets

RECONFIGURABLE DATA PROCESSING SYSTEM

FIELD OF THE INVENTION

The present invention relates to programmable processing systems, and more particularly to a programmable processing system useful for applications where size, power and weight are constraints.

BACKGROUND OF THE INVENTION

Data processing speeds and capabilities for real-time applications can vary with the particular application. Devices or systems may be designed to handle different applications, but the data processing component of the system is typically fixed in terms of size, power consumption and capability. Nevertheless, there is a need to accommodate different configurations and different architectures for each application.

For example, and not by way of limitation, in an unmanned aerial vehicle (UAV), size, weight, and power (SWAP) are important factors in the design of any part of the payload system. Thus, the processing component needs to be small in size, light in weight, and consume reasonably low power. A viable solution to handle different scenarios is to build a processing board that can be dynamically reconfigured according to the objectives of a particular application or mission of the host device, e.g., the UAV. The solution needs to have flexibility to adapt and reconfigure the hardware architecture to meet different applications and multi-mission modes, where the mission of the UAV may change during a flight session of the UAV.

SUMMARY OF THE INVENTION

Briefly, a reconfigurable processing system is provided that comprises a plurality of programmable processing modules arranged on a circuit board. Each of the programmable processing modules is capable of being populated by a programmable integrated circuit of a variety of processing capabilities. Conductive traces on the circuit board connect to the programmable processing modules and the conductive traces are arranged on the circuit board so as to accommodate use of the programmable integrated circuits of varying processing capabilities in the programmable processing modules without the need to alter conductive trace footprints on the circuit board for the programmable processing modules. At least one interface circuit arranged on the circuit board to interface signals to and from the circuit board.

DETAILED DESCRIPTION

Figure 1:
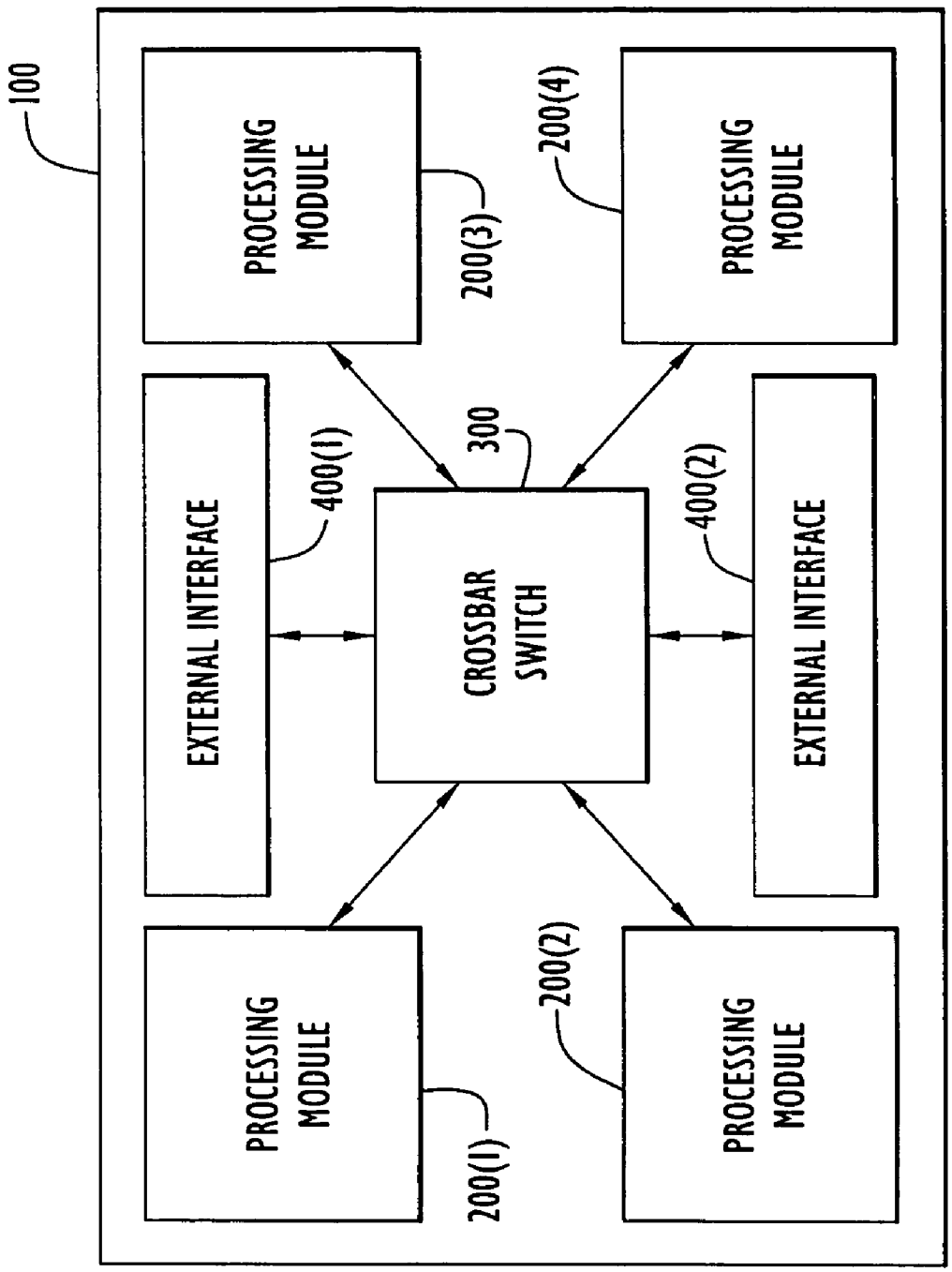
FIG. 1 is block diagram of a reconfigurable processing system according to one embodiment of the invention.

Referring first to FIG. 1, a reconfigurable processing system 10 in the form of a printed circuit board (PCB) 100 on which a plurality of processing modules 200(1) to 200(4) are provided. While four processing modules are shown, it should be understood that the invention is not limited to this number, and there may be more or fewer processing modules depending on a particular application, without departing from the scope and spirit of the invention. The processing modules 200(1) to 200(4) may be identical and each configured the same way to produce a symmetrical design. Alternatively, each module can be configured to achieve unique tasks, to allow for an implementation of front-end hardware high performance accelerators for complex applications.

There is a centrally positioned crossbar switch module 300 around which the processing modules 200(1)-200(4) are arranged. The crossbar switch module 300 is configured to allow all-to-all communication between all of the processing modules 200(1)-200(4). The crossbar switch module 300 is also the gateway to the outside world through external interface modules 400(1) and 400(2). The interface modules perform the necessary processing to interface data according to one or more standards, such as a VME bus, a PC104 bus, Ethernet, or a RS232 connector. The crossbar switch module 300 can also be configured as a front-end accelerator if required by a particular application architecture. Further, the crossbar module has a global memory chip, such as a synchronous dynamic random access memory (SDRAM) chip that can be accessed by any one of the four modules. In addition to the global memory, each module has its own local memory chips (SRAM) that can be used to store code and data for local operations. Further, each module includes FLASH memory to store code for stand-alone operation mode.

By the nature of the design, the reconfigurable processing board is a general purpose multi-processor system. It is useful for parallel real-time data processing algorithms or processes as well as simple single-processor applications. Large complex real-time applications can also use one or more of the processing modules 200(1) to 200(4) as hardware accelerators to enhance performance speed.

The reconfigurable processing system 10 is built with programmable devices such as field programmable gate arrays (FPGAs) that can be programmed for different hardware architectures. The PCB 100 can be populated with all components as a high-end product to achieve more computation power if needed. Alternatively, it can be populated with less parts as a low-end product to meet less demanding and less expensive applications.

Each of the processing modules 200(1) to 200(4) may be centered on the same FPGA part, such as an XC2Vx000 Virtex II FPGA built by Xilinx, Inc. This manufacturer of the FPGA chips builds a series of FPGA parts with different capacities but with the same footprint. Thus, the board uses FPGA parts that can be upgraded to a higher capacity using the same footprints. This means the board is designed to use variable size FPGA chips without the need to alter traces or footprints.

For example, the PCB 100 is designed with one footprint at each position shown in FIG. 1 for the processing modules 200(1)-200(4) that fits the following FPGA parts:

3 million gate FPGA, XC2V3000
4 million gate FPGA, XC2V4000
6 million gate FPGA, XC2V6000
8 million gate FPGA, XC2V8000

Thus, each of the processing modules 200(1) to 200(4) can be populated by 3, 4, 6, or 8 million gate FPGA chips. Each FPGA used in a processing module 200(1) to 200(4) can be programmed to include two general purpose floating point processors. For example, the FPGA in one or more of the processing modules 200(1) to 200(4) may be programmed with two Wafer Scale Signal Processors (WSSPs). This provides the ability of using 8 floating point signal processors that can be increased to 10 processors if the crossbar switch module 300 also is used to add more computation power to the board. The WSSP processor is optimized to give high computation power with less power consumption. The user defined instructions can be tailored to specific operations that are commonly used in certain applications such as matrix multiplication, and correlation functions as indicated in the user manual of the WSSP processor. Since each FPGA may be programmed for two processors, each processing module may be structured in a symmetric manner to allow identical resources for each processor.

The external interface modules 400(1) and 400(2) may have any desirable capability depending on the application of the system 10. For example, and not by way of limitation, the external interface module 400(1) implements a PC104 interface standard and the external interface module 400(2) implements a VME scalable bus standard. Thus, the PCB 10 may be compliant with a 6 U standard VME card and fit into any 6 U VME chassis. In addition, the external interface module 400(1) may also comprise an Ethernet connection interface, such as a 100/10 Base-T Ethernet connector standard, in order to exchange data at a rate of 100 Mbit/sec, which facilitates communication to and from the board through standard TCP/IP protocol. The Ethernet interface functionality can be configured to use custom communication on top of the standard TCP/IP protocol. Further still, for the purpose of hardware/software debugging of the system 10, the external interface module 400(2) comprises an RS232 connector that can be connected to a dumb terminal.

Figure 2:
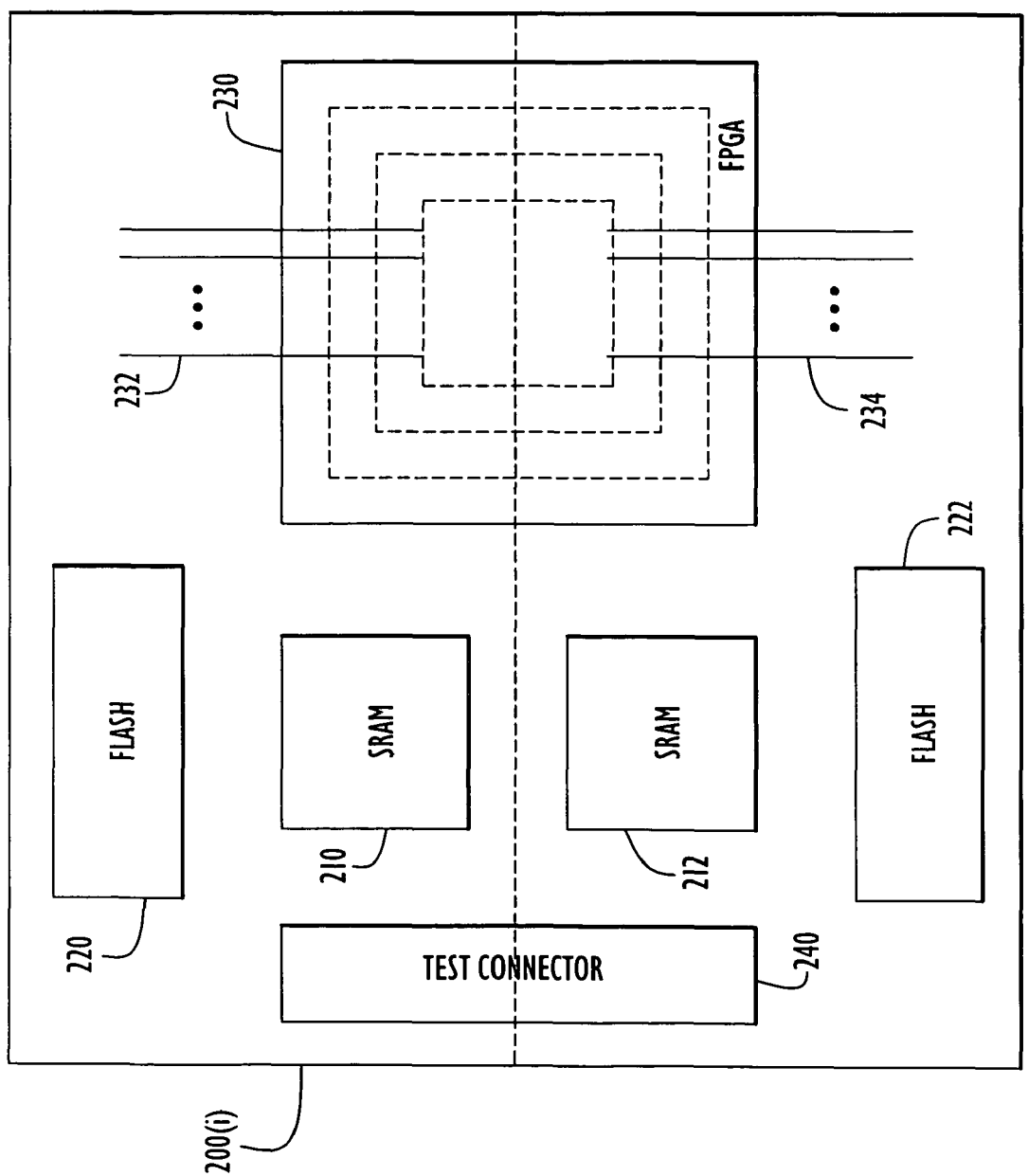
FIG. 2 is a block diagram of a processing module, multiple instances of which are provided in the reconfigurable processing system according to an embodiment of the invention.

Turning to FIG. 2, a processing module 200(i) is shown and will be described in detail. Each processing module comprises two static memories, such as static random access memory (SRAM) 210 and 212, two FLASH memories 220 and 222, an FPGA chip 230 and a test connector 240. The size of the SRAM chip and the size of the FLASH chip vary with a particular application. The components in the processing module 200(i) are arranged symmetrically around a virtual horizontal line. The symmetry is designed to support the two WSSP processors, described above, that can be programmed into one FPGA chip. However, the symmetry may be useful for other hardware processing architectures.

The SRAM memory chips 210 and 212 are used for application data and temporary storage of intermediate results while the application is executed. The SRAM chips are high speed devices and can therefore serve as a level 2 cache.

The FLASH memory chips 220 and 222 are dedicated for storing bootstraps and application programs. The use of the FLASH prevents loss of program code when power to the system 10 is lost. In addition, the FLASH memory chips 220 and 222 may be programmed through the Ethernet connection.

The test connector or socket 240 is connected to I/O pins of the FPGA chip 230 and is used to monitor arbitrary signals inside the FPGA chip 230 through any standard logic analyzer.

Power is distributed across the PCB 100 (FIG. 1) so that each processing module 200(1) to 200(4) has its own localized power supply. The distribution of power helps in providing homogeneous temperature distribution around the board and makes it easy to partially populate the PCB 100 with processing modules.

Conductive traces 232 and 234 on the circuit board connect to the programmable processing modules and the conductive traces are arranged on the circuit board so as to accommodate use of the programmable integrated circuits of varying processing capabilities in the programmable processing modules without the need to alter conductive trace footprints on the circuit board for the programmable processing modules.

Figure 3:
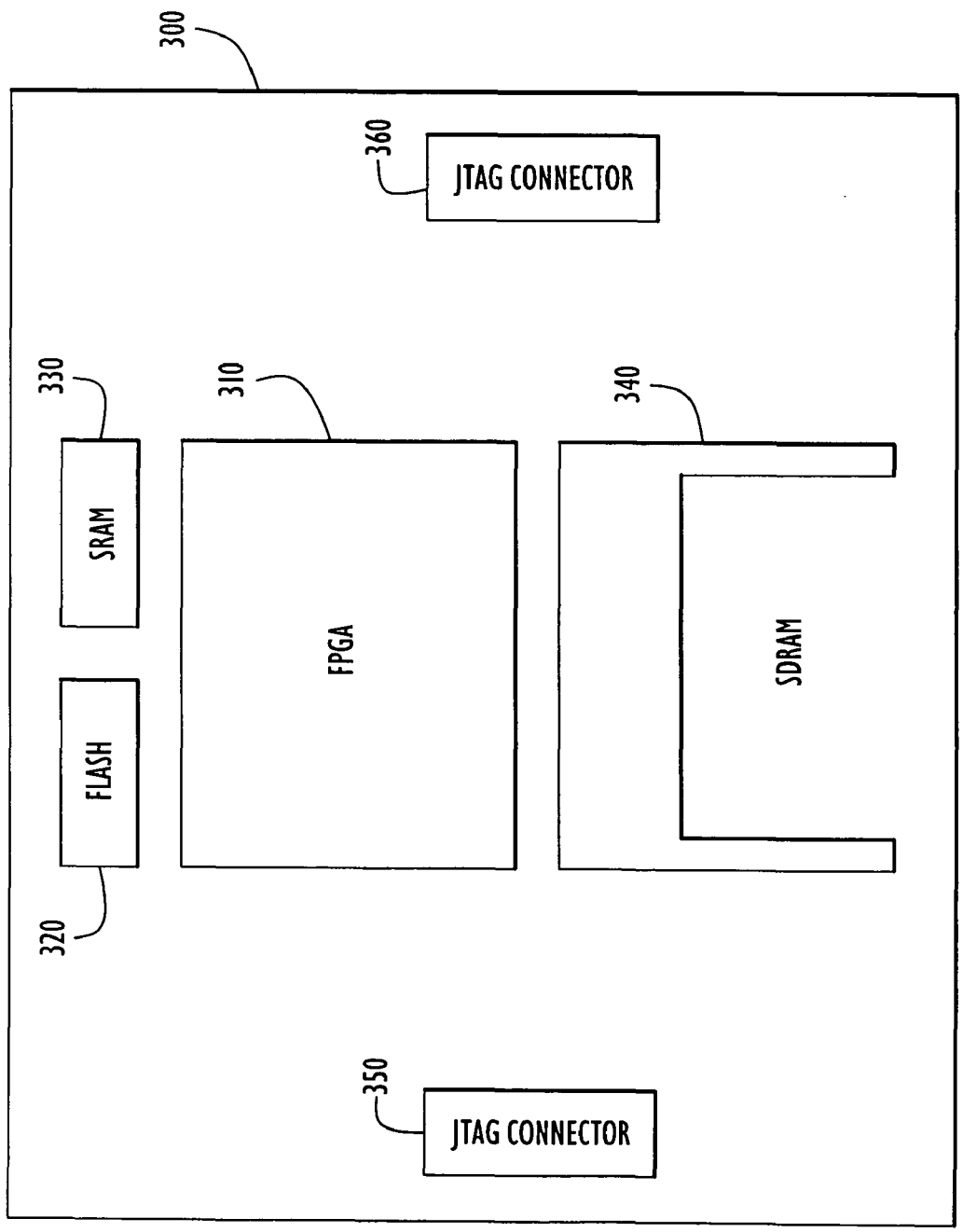
FIG. 3 is a block diagram of a switch module included in the reconfigurable processing system according to an embodiment of the invention.

Turning to FIG. 3, the crossbar switch module 300 is described in greater detail. The crossbar switch module 300 provides connection between the other processing modules and to external devices through the external interface modules 400(1) and 400(2).

The crossbar switch module 300 comprises an FPGA chip 310, a FLASH memory 320, a static memory (e.g., SRAM) chip 330 and a socket 340 for dynamic memory, such as for a synchronous Dynamic Random Access Memory (SDRAM) chip. In addition, the crossbar switch module 300 comprises at least two joint test activity group (JTAG) connectors 350 and 360. The crossbar switch module 300 can be configured as a general purpose processor if a particular application of the system 10 requires extra computation power. The SRAM 330 and local FLASH memory 320 are provided to support the configuration of the module 300 as a general purpose processor. The socket 340 can receive a SDRAM chip that works as a global memory for all processor modules 200(1) to 200(4) on the PCB 100. One use of the SDRAM in the socket 340 is as the gateway to the outside world through a VME bus. Data cubes or global data storage can utilize the SDRAM in the socket 340 so that each processor module takes its share of the data and stores it in its local memory. Alternatively, the SDRAM in the socket 340 can be used as a local memory available for the crossbar switch module 300 if it is configured as a general purpose processor as mentioned above.

The JTAG connectors 350 and 360 are used to program either the FPGA chips in the respective processing modules 200(1) to 200(4) or the configuration FLASH memories associated with the FPGA in each of the processing modules 200(1) to 200(4). The JTAG connectors 350 and 360 form two daisy chains. The JTAG daisy chains have jumpers to compensate for the unpopulated parts in case of low-end applications.

Figure 4:
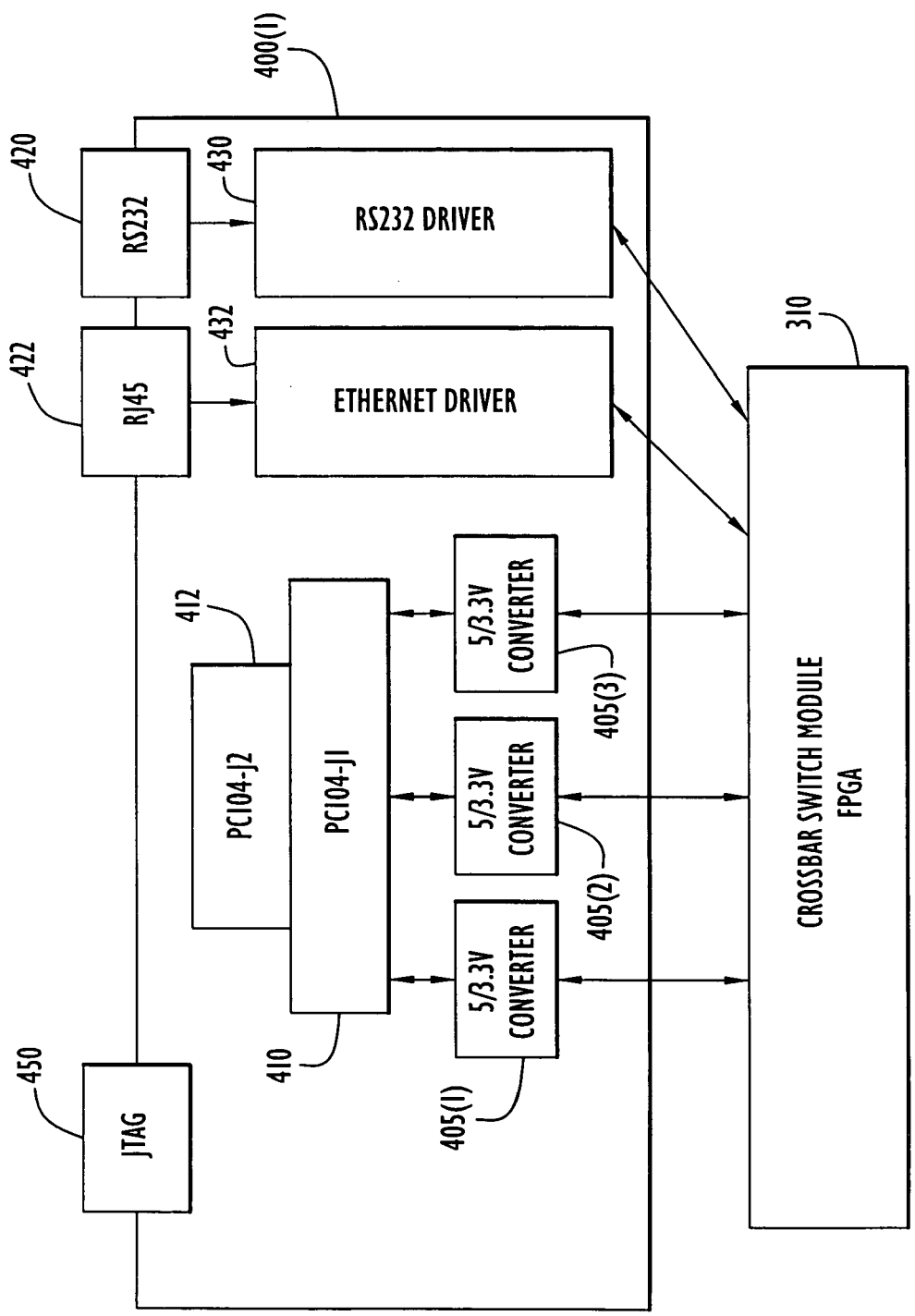
FIG. 4 is a block diagram of a first interface module useful in the reconfigurable processing system according to an embodiment.

Reference is now made to FIG. 4 for a more detailed description of the external interface module 400(1). The external interface module 400(1) comprises industry standard interface connectors, such as the industry standard PC104 interface connector PC104-J1 at reference numeral 410 and interface connector PC104-J2 at reference numeral 412. All PC104 signals and the standard connector size are implemented so that the PCB 100 can interface to any PC104 system through a standard PC104 ribbon cable or stackable cards. There are three 5V/3.3V converters 405(1), 405(2) and 405(3) that connect pins on the PC104 connectors 410 and 412 to the crossbar switch module FPGA 310.

The external interface module 400(1) further includes RS232 and RJ45 Ethernet connectors 420 and 422 and associated driver circuits 430 and 432 capable of supporting up to 100 Mbit/sec using the TCP/IP protocol. The RS232 DB9 connector 420 and driver circuit 430 are useful when debugging and testing the system 10. The RS232 transmit and receive signals are connected to the crossbar switch module FGPA 310 then to the rest of the modules on the PCB 10. The Ethernet driver circuit 432 is connected to the I/O pins of the crossbar switch module 300 to provide interface to the rest of the modules on the PCB 100. There is also a JTAG connector 440 that is capable of connecting to a JTAG-compliant programming and test device.

Figure 5:
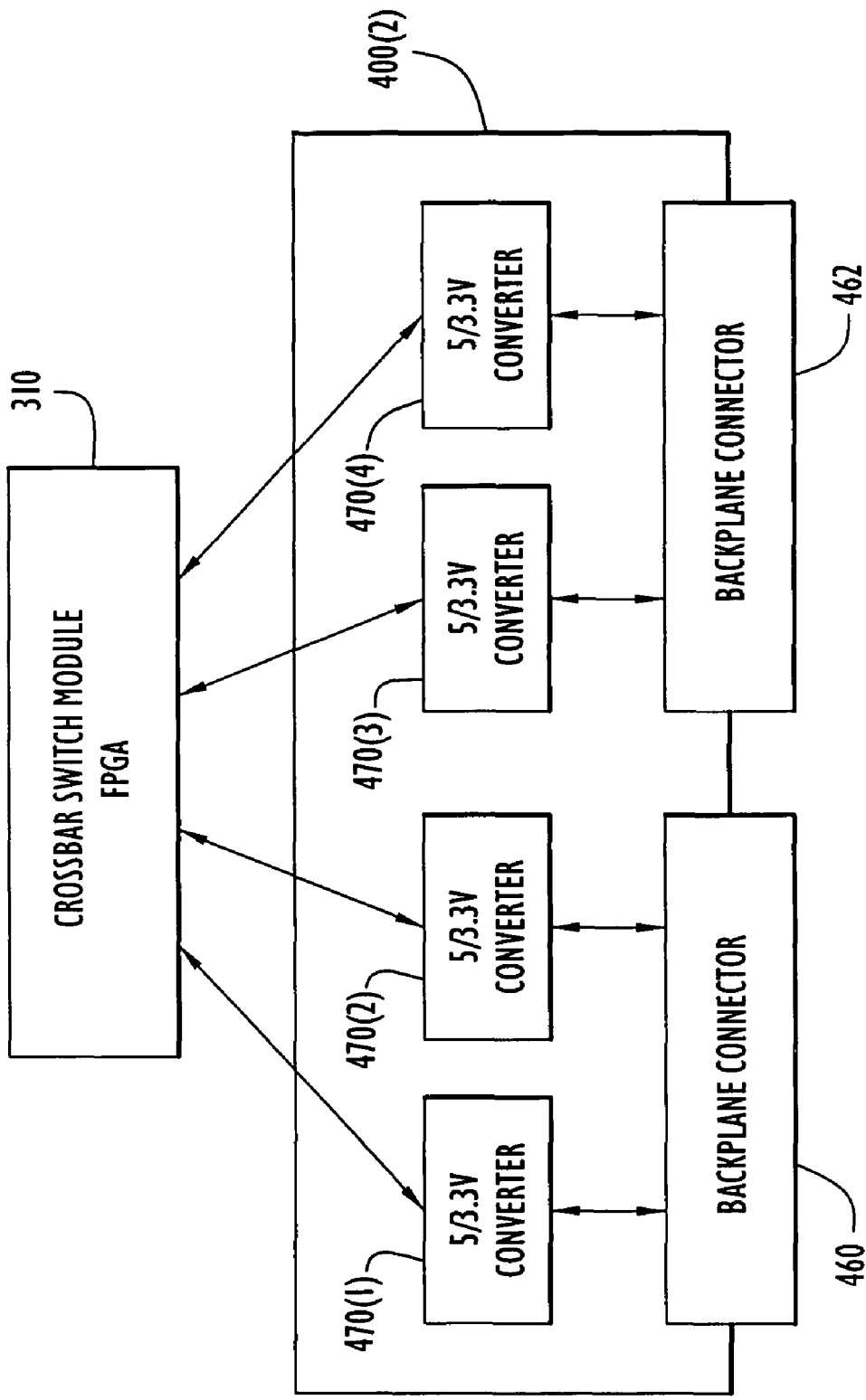
FIG. 5 is a block diagram of a second interface module useful in the reconfigurable processing system according to an embodiment.

Turning to FIG. 5, the external interface module 400(2) is described. The external interface module 400(2) connects the board to the outside world through a VME bus. The external interface module 400(2) comprises backplane connectors 460 and 462. The external interface module 400(2) further comprises 5V/3.3V converters 470(1) and 470(2) through which the backplane connector 460 is connected to the crossbar switch module 300 and 5V/3.3V converters 470(3) and 470(4) through which the backplane connector 462 connects to the crossbar switch module FPGA 310.

The design philosophy of the configurable processing module is based on providing the user total flexibility in building the hardware architecture. Each processing module can be configured in the same exact way to form a homogeneous system. Alternatively, each processing module can be configured differently according to the application needs to form a heterogeneous system that performs specific applications.

For applications that do not need full floating point processors, the FPGA chips can be programmed to resemble simple low-end integer processors. As an example, each of the four processing modules 200(1) to 200(4) can be programmed as 8-bit simple compute units, thus creating a network of massive parallel compute units. This is very useful for such applications that need only 8-bit integer operations for image processing or image/data compression. This is also useful when the domain of the application can be divided into data subsets so that each subset of the image or the data can be processed the same way in parallel to achieve the objective of the software application. This type of architecture is called Single Instruction Multiple Data (SIMD).

Another way of configuring the hardware architecture is the Multiple Instruction Multiple Data (MIMD). In this type of architecture, each one of the massive processors does not have to be programmed the same exact way. Some of the parallel processors can be programmed differently to execute specific pieces of the applications.

Still other parallel processor architectures such as Multiple Instruction Single Data (MISD) and (Single Instruction Single Data (SISD) can be configured as well.

In addition to the parallel processor architectures, some applications may require a sequential hardware architecture but with increased speed of performance. In such applications, some of the software modules can be offloaded from the crossbar switch module and implemented on the FPGA chips of the separate processing modules so that one or more of the processing modules 200(1) to 200(4) serves as a front-end processor or as hardware accelerator. For instance, a Fast Fourier Transform (FFT) engine can be implemented on one of the FPGA chips to process data on the fly before reaching the FPGA chip on the crossbar switch module 300. Alternatively, a correlation engine can be programmed in the FPGA chip on one of the processor modules 200(1) to 200(4) to speed up the execution time of a time critical applications. Further still, the FPGA chip on one of the processor modules 200(1) to 200(4) can be programmed to perform a matrix multiplication function that is called many times during execution of another time critical application. These are just examples of the numerous configurations that are possible.

Figure 6:
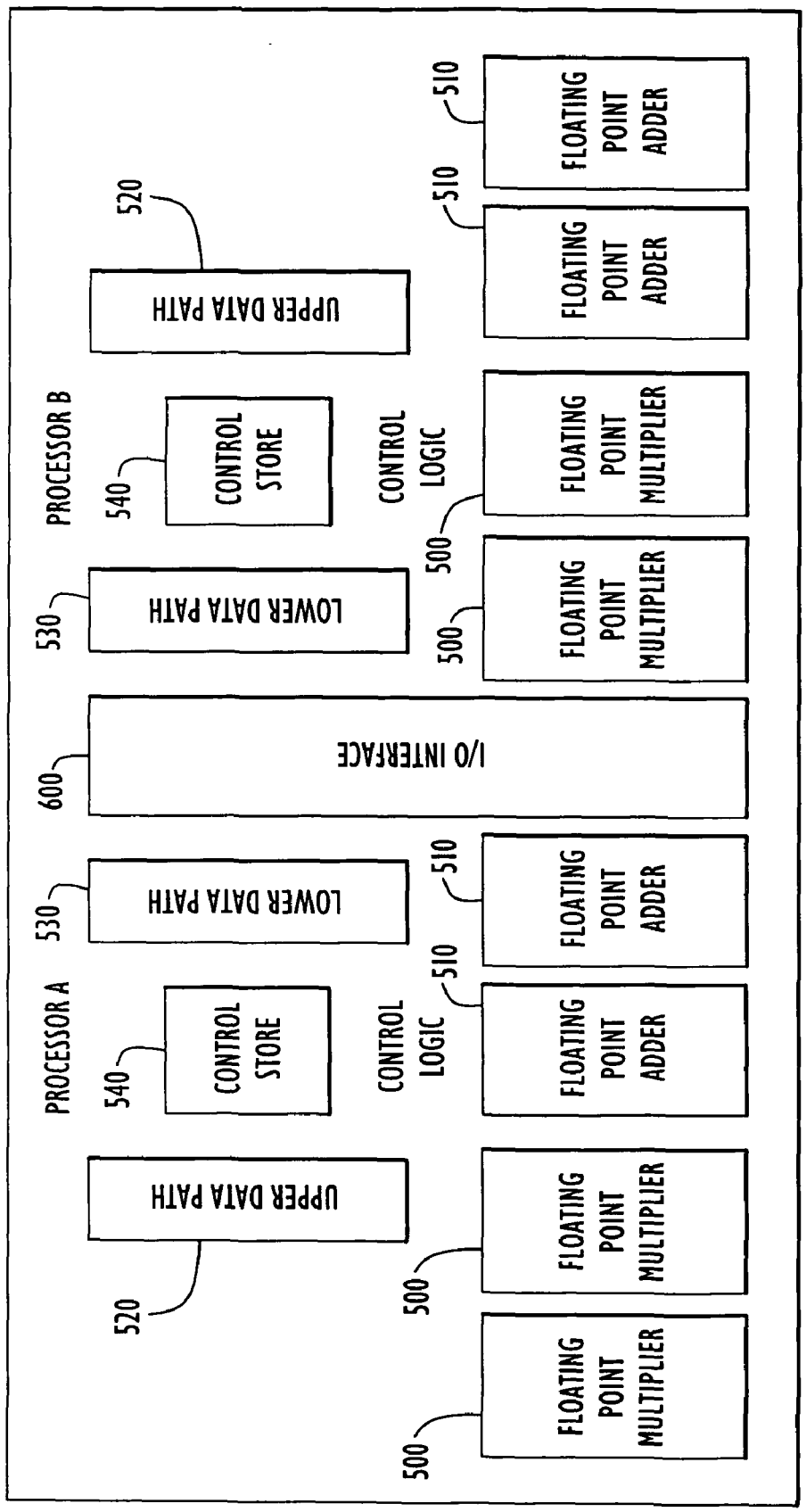
FIG. 6 is a block diagram showing a programmable processing module forming a part of the reconfigurable processing system, where the programmable processing module is programmed with two wafer scale signal processors according to one embodiment.

Reference is now made to FIG. 6. One processor useful in the configurable processing system 10 is the aforementioned WSSP architecture. FIG. 6 shows the various components of two WSSP implemented in a FPGA chip 230 of a processing module 200(i), shown as Processor A and Processor B. Each WSSP processor has four floating point units; two multipliers 500 and two adders 510 and a control logic section comprising an upper data path logic 520, lower data path logic 530 and a control store 540. There is an input/output (I/O) interface logic block 600.

With the four parallel floating point units, each WSSP is capable of peak performance of up to 4 FLOPS/clock. In addition to the exceptional floating point performance, the WSSP assembly instruction set is optimized for signal processing functions. There are several vectorized assembly instructions that perform complete functions such as fast Fourier transform, and complex dot products. The assembly instructions are optimized to give max performance with the architecture of the WSSP and at the same time keeping low power consumption.

The WSSP is also equipped with a mechanism that allows a user to build his/her own intrinsic assembly instruction to optimize the performance of the application. This is done through the micro-code RAM that resides inside the core of the WSSP. The user can write his/her own function that can be downloaded on to the micro RAM. Then, a unique assembly instruction is assigned to the new micro-code function. During the execution of the program, the new function can be called the same way as any regular assembly instruction.

The WSSP processor comes with a complete suite of software tools based on the open source GNU software tools. The GNU tools for the WSSP processor include compilers for C, C++, and FORTRAN. In addition to the compilers and assemblers, the WSSP software suite has an Instruction Set Architecture (ISA) simulator. The ISA simulator simulates the execution of the application instruction by instruction and is a useful tool in the phase of testing and debugging. The ISA simulator can be applied to the application before building the actual hardware.

In addition to identifying problems, the ISA simulator can generate an accurate estimation report of the performance speed of any application. The performance speed can be accurately measured by the number of clock cycles taken by each assembly instruction of the entire application program. The ISA simulator has profiling capability as well as generating reports for all function calls and memory/cache access statistics.

Figure 7:
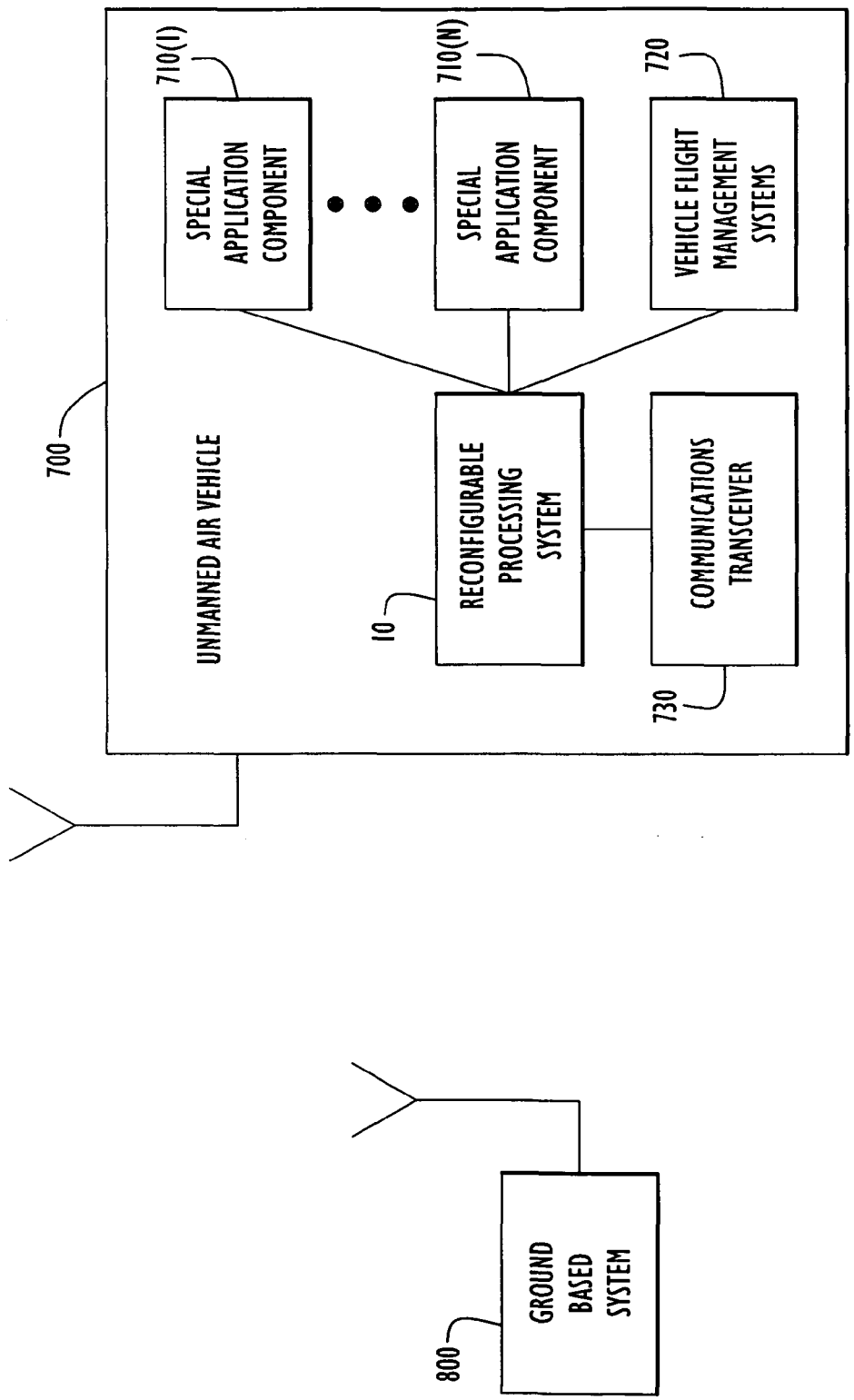
FIG. 7 is a block diagram of an unmanned aerial vehicle comprising the reconfigurable processing system according to the embodiments of the invention.

With reference to FIG. 7, according to one embodiment one application of the reconfigurable processing system 10 is in an Unmanned Aerial Vehicle (UAV) shown at reference numeral 700. The UAV 500 includes a variety of onboard devices or subsystems that monitor activity around the UAV and collect information, such as digital still and moving video images, weather data, radio frequency receiver data, etc. To this end, the UAV may have one or more so-called special application components or subsystems shown at reference numerals 710(1) to 710(N) and one or more vehicle flight management subsystem, one of which is shown at reference numeral 720. The reconfigurable processing system 10 connects to the special application components to process the data that they produce and also connects to the flight management subsystem 720. As a result, the UAV 700 can perform data processing onboard so that the amount of data it needs to transmit to the ground is reduced. The UAV 700 includes a communications transceiver subsystem 730 that is used to transmit data to, and receive data and controls, from ground-based equipment shown at reference numeral 800.

UAVs are useful in military reconnaissance and weather monitoring (among other) applications. In these types of UAV applications, raw information collected by the UAV is passed to the ground station for near or real-time processing and evaluation by the ground crew. In some situations, there are several UAVs simultaneously sending raw information to a ground station. It is therefore desirable to move some or all of the processing power and intelligent decisions to onboard the UAV to reduce the amount of data transmitted from the UAV to the ground.

One technique to reduce the amount of information the UAV transmits is to transmit information only when a situation of relevance is detected. The reconfigurable processing subsystem is programmed with one or more processing algorithms that analyzes the data produced by the one or more special application subsystems and supplies information to the communications transceiver for transmission to a remotely located system only when a situation of relevance is detected based on the analysis of the data. Thus, the notion of information of relevance (IOR) is introduced, meaning the UAV sends only relevant information. For example, the reconfigurable processing system 10 may be programmed with processing algorithms that detect a moving ground target and trigger the transmission of data (video and other) to the ground, or that using pattern recognition, detect a particular occurrence of interest (e.g., missile launch), or that measure weather conditions and transmit data when a significant weather event is detected.

The onboard reconfigurable processing subsystem may allow the UAV to have autonomous behavior. For example, the reconfigurable processing subsystem 10 onboard a UAV may detect a suspicious target based on data supplied by one or more of the special application subsystems and take action without external intervention (externally supplied controls) to alter the flight or navigation path/plan of the UAV to circle (approach) and investigate the target in more detail. The target may be a particular type of threat, such as a missile or other type of weapon or facility. Again, the intelligence to make these navigation changes contained in programming control instructions configured into the processing subsystem 10 onboard the UAV.

Furthermore, the variety of UAV operations and missions mandate different configurations and different architectures for each mission. Therefore, a viable solution to handle multi-mission scenarios is to use a processing board that can be dynamically reconfigured according to each mission's objectives. For example, the mission of the UAV may change while in flight.

In the UAV environment, size, weight, and power (SWAP) are important factors in the design of any part of the payload system. That implies that the UAV systems or components should be small in size, light in weight, and consume reasonably low power. For a UAV, the processing board 100 is approximately 6" by 7" in size in one example, but its size may vary depending on a particular host device, etc.

Reconfigurable boards for on-board processing contribute to realizing the full potential of systems that could benefit from high computing power in a low-powered, small sized footprint. By driving computing power onboard, the UAV 500 can determine what information is relevant to current situations and take appropriate actions. By reducing SWAP while increasing computation power, reconfigurable on-board processing technology enables current and future UAVs to increase mission capabilities in the same or smaller packages, benefiting stakeholders throughout the chain.

Examples of other applications of the reconfigurable processing system 10 include (but are not limited to): Unmanned Ground Vehicles (UGV), Unmanned Underwater Vehicles (UUV), satellites, airborne communication and data networks, space-based applications, communication applications such as a Software Defined Radio (SDR), cognitive computing applications that require massive processor architecture, man-portable devices that require high processing power, and in general any device or system that may have multi-mission, high bandwidth, or high processing requirements.

The system and methods described herein may be embodied in other specific forms without departing from the spirit or essential characteristics thereof. The foregoing embodiments are therefore to be considered in all respects illustrative and not meant to be limiting.

What is claimed is:

1. A reconfigurable processing board, comprising: a circuit board; a plurality of programmable processing modules on the circuit board, each comprising a programmable integrated circuit chip at least one external interface circuit arranged on the circuit board to interface signals to and from the circuit board; a switch module mounted on said circuit board, wherein the switch module comprises a field programmable gate array (FPGA) and a memory device, and at least one connector connected to the FPGA and configured to connect to a programming device to facilitate programming of the FPGA of the switch module and thereby configure the switch module for operations with respect to the plurality of programmable processing modules: conductive traces on the circuit board that connect to the programmable processing modules, wherein the conductive traces are arranged on the circuit board so as to accommodate use of the programmable integrated circuits of varying processing capacities in the programmable processing modules without the need to alter conductive trace footprints on the circuit board for the programmable processing modules and wherein the conductive traces on the circuit board connect said switch module to each of the programming processing modules and to the at least one external interface circuit, wherein each programmable processing module comprises at least one field programmable gate array (FPGA), at least two random access memory devices configured to directly connect to the FPGA, and at least two FLASH memory devices configured to directly connect to the FPGA, and wherein the FPGA, random access memory devices and FLASH memory devices are arranged symmetrically around a virtual line dividing the programmable processing module.

2. The reconfigurable processing board of claim 1, wherein the programmable integrated circuit in the plurality of programmable processing modules is a field programmable gate array (FPGA).

3. The reconfigurable processing board of claim 2, wherein the conductive trace footprints on the circuit board for the programming processing modules are capable of accommodating FPGAs of varying capacities.

4. The reconfigurable processing board system of claim 1, wherein the FPGA in at least one programmable processing module is programmed with two wafer scale signal processors (WSSPs).

5. The reconfigurable processing board of claim 1, wherein the switch module is configured to enable all-to-all communication among the programmable processing modules.

6. The reconfigurable processing board of claim 5, wherein the memory device in the switch module is configured to serve as a global memory for one or more of the programmable processing modules.

7. The reconfigurable processing board of claim 6, wherein the switch module comprises a socket for receiving the memory device.

8. The reconfigurable processing board of claim 5, wherein the switch module is positioned in a central position of the circuit board, and the programmable processing modules are positioned on the circuit board around the switch module.

9. The reconfigurable processing board of claim 5, wherein the at least one connector is configured to enable connection of a programming device for programming the programmable integrated circuit of respective ones of the plurality programmable processing modules.

10. The reconfigurable processing board of claim 1, wherein the programmable integrated circuit in each programmable processing module is an FPGA of the same or different capacity.

11. An onboard vehicle control system comprising the reconfigurable processing board of claim 1, and further comprising:
a vehicle management subsystem that manages navigation and movement of a vehicle;
one or more special application subsystems that monitor activity around said vehicle and collect data pertaining to said activity;
a communications transceiver subsystem that communicates data and controls to and from a remotely located system; and
wherein the reconfigurable processing board is configured to process data produced by the one or more of the special application subsystems and vehicle management subsystem.

12. The control system of claim 11, wherein the programmable integrated circuit in the plurality of programmable processing modules is a field programmable gate array (FPGA), and wherein the conductive trace footprints on the circuit board for the programming processing modules are capable of accommodating FPGAs of varying capacities.

13. The control system of claim 12, wherein each programmable processing module comprises at least one field programmable gate array (FPGA), at least two random access memory devices, and at least two FLASH memory devices, and wherein the FPGA, random access memory devices and FLASH memory devices are arranged symmetrically around a virtual line dividing the programmable processing module.

14. The control system of claim 13, wherein the FPGA in at least one programmable processing module is programmed with two wafer scale signal processors (WSSPs).

15. The control system of claim 11, and further comprising a switch module mounted on said circuit board, wherein the conductive traces on the circuit board connect said switch module to each of the programmable processing modules and to said at least one external interface circuit.

16. The control system of claim 15, wherein said switch module comprises a field programmable gate array (FGPA) device and a memory device, wherein the memory device in the switch module serves as a global memory for one or more of the programmable processing modules.

17. The control system of claim 11, wherein the switch module is positioned in a central position of the circuit board, and the programmable processing modules are positioned on the circuit board around the switch module.

18. The control system of claim 11, wherein the vehicle is an unmanned aerial vehicle and wherein the vehicle management subsystem is a vehicle flight management subsystem that controls movement of the unmanned aerial vehicle.

19. The control system of claim 11, wherein the reconfigurable processing board is programmed with one or more processing algorithms that analyzes the data produced by the one or more special application subsystems and supplies information to the communications transceiver subsystem for transmission to a remotely located system only when a situation of relevance is detected based on the analysis of the data.

20. The control system of claim 11, wherein the reconfigurable processing board is programmed to analyze data produced by the one or more special application subsystems to detect a target and in response to detecting the target said reconfigurable processing board, without externally supplied controls, alters a navigation plan of the vehicle in order to control the vehicle to approach the target for further investigation.

21. A reconfigurable processing board, comprising: a circuit board; a plurality of programmable processing modules on the circuit board, each comprising a field programmable gate array (FPGA) device conductive traces on the circuit board that connect to the programmable processing modules, wherein the conductive traces are arranged on the circuit board so as to accommodate use of the FPGA of varied capacities in the programmable processing modules without the need to alter conductive trace footprints on the circuit board for the programmable processing modules; a switch module and at least one external interface circuit mounted on the circuit board, wherein the conductive traces on the circuit board connect said switch module to each of the programmable processing modules and to said at least one external interface circuit, wherein the switch module comprises a field programmable gate array (FPGA) and a memory device, and at least one connector connected to the FPGA and configured to connect to a programming device to facilitate programming of the FPGA of the switch module and thereby configure the switch module for operations with respect to the plurality of programmable processing modules, wherein each programmable processing module comprises at least one field programmable gate array (FPGA), at least two random access memory devices configured to directly connect to the FPGA, and at least two FLASH memory devices configured to directly connect to the FPGA, and wherein the FPGA, random access memory devices and FLASH memory devices are arranged symmetrically around a virtual line dividing the programmable processing module.

22. The reconfigurable processing board of claim 21, wherein the switch module is configured to enable all-to-all communication among the programmable processing modules.

23. The reconfigurable processing board of claim 1, wherein the switch module is configurable to operate as a general purpose processor for additional computing power for the reconfigurable processing system, and wherein the memory device of the switch module is configured to support operation of the switch module as a general purpose processor.

24. The reconfigurable processing board of claim 1, wherein power is distributed across the circuit board so that each programmable processing module has its own localized power supply so as to provide a homogeneous temperature distribution around the circuit board.

* * * * *